United States Patent [19]
Ishiyama

[11] Patent Number: 5,968,195
[45] Date of Patent: Oct. 19, 1999

[54] ESTIMATION OF FAILURE SECTION REGION WITH SMALL SIMULATION CALCULATION QUANTITY

[75] Inventor: Toshio Ishiyama, Tokyo, Japan

[73] Assignee: NEC Corporation, Tokyo, Japan

[21] Appl. No.: 08/905,641

[22] Filed: Aug. 4, 1997

[30] Foreign Application Priority Data

Aug. 19, 1996 [JP] Japan ................................. 8-217301

[51] Int. Cl.$^6$ .................................................. G01R 31/28
[52] U.S. Cl. .......................... 714/727; 714/728; 714/741
[58] Field of Search .................................. 714/727, 728, 714/726, 724, 738, 739, 741, 30, 33; 395/500; 364/578, 264.3

[56] References Cited

U.S. PATENT DOCUMENTS

| | | | |
|---|---|---|---|
| 4,855,670 | 8/1989 | Green ...................................... | 714/726 |
| 4,937,765 | 6/1990 | Shupe et al. ............................ | 714/736 |
| 5,633,813 | 5/1997 | Srinivasan .............................. | 395/500 |
| 5,640,403 | 6/1997 | Ishiyama et al. ....................... | 364/578 |

FOREIGN PATENT DOCUMENTS

6-194416  7/1994  Japan .

Primary Examiner—Trinh L. Tu
Attorney, Agent, or Firm—Scully, Scott, Murphy & Presser

[57] ABSTRACT

In a failure section estimating apparatus for a sequential circuit, when it is determined that the failure section is positioned in the current stage combination circuit, an input vector estimating section estimates input vectors each of which sets to a failure state, at least a predetermined output section as a failure output section of an output boundary of a current stage combination circuit of the sequential circuit. A failure output propagation path determining section determines a failure output propagation region in the current stage combination circuit for each of the estimated input vectors to be applied to an input boundary of the current stage combination circuit. The failure output propagation region represents connection paths between the failure output section and input sections of the input boundary to which the failure output section is indirectly connected. A detecting section detects incorrect output sections which represent normal outputs when a test vector is applied to the sequential circuit and incorrect outputs when the each estimated input vector is applied to the input boundary. An incorrect output propagation path determining section determines an incorrect output propagation region for each of the incorrect output sections. The incorrect output propagation region represents connection paths between the each incorrect output section and input sections of the input boundary to which the each incorrect output section is indirectly connected. A failure section estimating section estimates a failure section from the failure output propagation region and the incorrect output propagation region for the each estimated input vector.

12 Claims, 9 Drawing Sheets

COMBINATIONAL CIRCUIT 201

ESTIMATION OF FAILURE SECTION REGION WITH SMALL SIMULATION CALCULATION QUANTITY

BACKGROUND OF THE INVENTION

1. Field of the Invention

The present invention relates to a failure diagnosis of an LSI of a sequential circuit, and more particularly to estimation of a failure section region of a sequential circuit in an LSI without a failure dictionary.

2. Description of the Related Art

As conventional failure section estimating technique of a sequential circuit of an LSI, various methods are known. For example, in a method, a failure dictionary is previously produced, and the failure dictionary is referred to based on an actually detected failure state to estimate a failure section. Also, there is another method in which the states of flip-flop circuits are read by use of a scan pass to estimate a failure section, as disclosed in Japanese Laid Open Patent Disclosure (JP-A- Heisei 6-194416).

Figure 1:
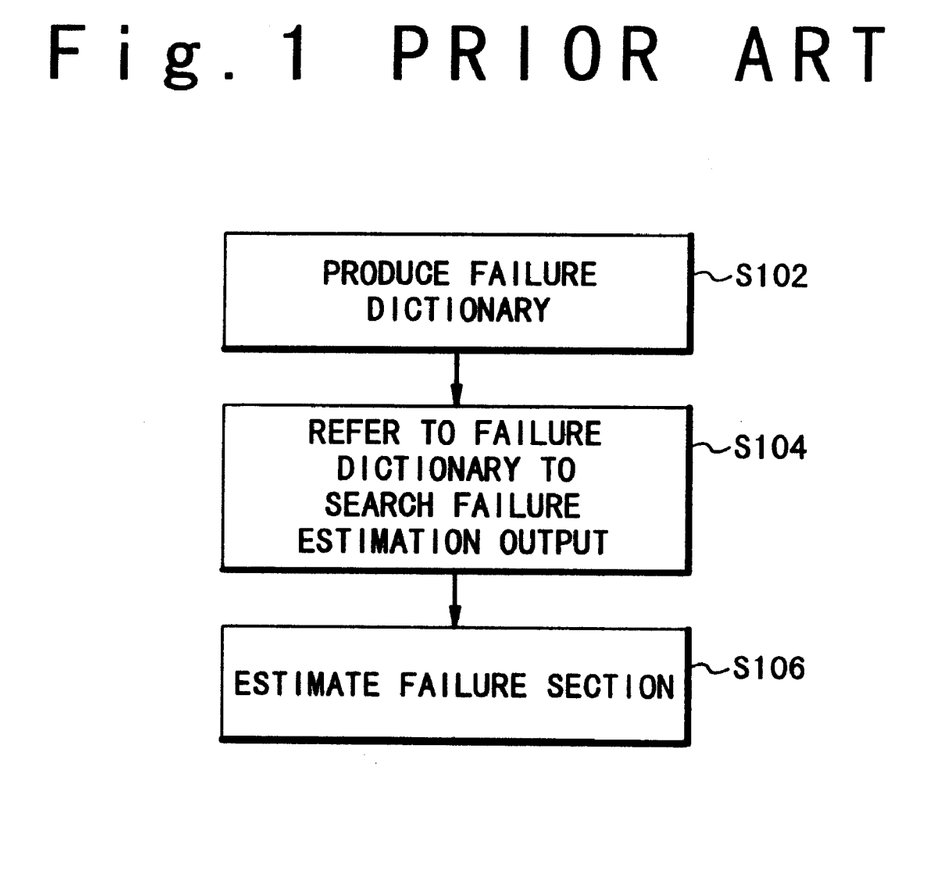
FIG. 1 is a flow chart illustrating an example of a conventional method of estimating a failure section by use of a failure dictionary.

FIG. 1 is a flow chart illustrating an example of the conventional method of estimating a failure section using a failure dictionary. In the conventional example, the simulation when a failure section is inserted in a sequential circuit, i.e., failure simulation is performed using an actual test vector. A failure dictionary data file which indicates a relation of information of the inserted failure section and the failure states of output terminals is previously produced (step S102). After that, a test of a sequential circuit is actually performed using a test vector. The failure dictionary is referred to based on the information of the output terminals of the failure states in the test result to determine a candidate point of the failure section (step S104). This step is performed to all the test vectors. Next, the priority levels are sequentially allocated to the plurality of determined failure candidates from the section having the highest failure possibility for estimating the failure section (step S106).

On the other hand, when a scan pass is used, a checking circuit whose state can be written and read is previously provided in the sequential circuit. The states of flip-flop circuits are set using the checking circuit. After the sequential circuit operates, the states of the flip-flop circuits are read out. The read out states and expected values are compared to determine whether or not the failure state is propagated from a previous stage circuit. The estimation of the failure section is performed based on the determining result.

However, there are problems in the above-mentioned conventional methods of estimating the failure section of the sequential circuit section, as described below.

That is, in the method of using a failure dictionary, it is necessary to previously perform a failure simulation to the whole sequential circuit and to prepare the failure dictionary to the failure outputs. In this case, the failure simulation must be performed, assuming a failure about each of expected nodes such as latch circuits and gate circuits. Therefore, there is a problem in that it takes long time to produce the failure dictionary. In this case, it could be considered that the sequential circuit is grouped into a plurality of parts and that the failure dictionary corresponding to each of the parts is produced. Even in the case, however, a great amount of time would be needed to produce the failure dictionary. The problem would be left that the runtime becomes longer with development of a large scaled sequential circuit.

Also, because a failure model treated in the failure simulation generally is a single degenerated failure, there is the possibility that the estimated failure is not coincident with an actual failure in a multiple failure such as a bridge failure. In such a case, it could be considered that the failure simulation is extended to the multiple failure. However, because the processing time increases to a great extent, the failure simulation is not in practice.

Next, in the method of using a scan pass, it is necessary to incorporate the checking circuit of flip-flop circuits in the sequential circuit. In accordance with, there is a problem that the scan pass method can not be applied in a sequential circuit in which the checking circuit is not incorporated.

SUMMARY OF THE INVENTION

The present invention is accomplished in the light of above-mentioned problems in the conventional technique. An object of the present invention is to provide a failure section estimating system and a method of estimating a failure section, in which a failure section of a sequential circuit can be estimated without needing a great amount of calculation time.

Another object of the present invention is to provide a failure section estimating system and a method of estimating a failure section, which can be applied to a sequential circuit having a multiple failure.

In order to achieve an aspect of the present invention, a failure section estimating apparatus for a sequential circuit, includes an input vector estimating section for estimating input vectors each of which sets to a failure state, at least a predetermined output section as a failure output section of an output boundary of a current stage combinational circuit of the sequential circuit, when it is determined that the failure section is positioned in the current stage combinational circuit, a failure output propagation path determining section for determining a failure output propagation region in the current stage combinational circuit for each of the estimated input vectors to be applied to an input boundary of the current stage combinational circuit, wherein the failure output propagation region represents connection paths between the failure output section and input sections of the input boundary to which the failure output section is indirectly connected, a detecting section for detecting incorrect output sections which represent normal outputs when a test vector is applied to the sequential circuit and incorrect outputs when the each estimated input vector is applied to the input boundary, an incorrect output propagation path determining section for determining an incorrect output propagation region for each of the incorrect output sections, wherein the incorrect output propagation region represents connection paths between the each incorrect output section and input sections of the input boundary to which the each incorrect output section is indirectly connected, and a failure section estimating section for estimating a failure section from the failure output propagation region and the incorrect output propagation region for the each estimated input vector.

In this case, the failure section estimating section may include a section for subtracting the incorrect output propagation region for the each estimated input vector from the failure output propagation region, wherein a remaining portion is the failure section. Alternatively, the failure section estimating section may include a section for detecting an intersection node between the failure output propagation region and the incorrect output propagation region for the each estimated input vector, and a section for subtracting a part of the incorrect output propagation region which is located on an input boundary side from the detected intersection node from the failure output propagation region, wherein a remaining portion is the failure section.

In both cases, the failure section estimating section desirably includes a section for weighting the failure section estimated from the failure output propagation region and the incorrect output propagation region for the each estimated input vector for all the estimated input vectors.

The failure section estimating apparatus for a sequential circuit may further includes a combinational circuit extracting section for extracting the current stage combinational circuit when it is determined that there is the failure section in the sequential circuit, and a determining section for determining whether there is the failure section in the current stage combinational circuit of the sequential circuit, and for activating the combinational circuit extracting section for a front stage combinational circuit which has the input boundary of the current stage combinational circuit as an output boundary.

The failure section estimating apparatus for a sequential circuit may further includes a test section for applying section for applying the test vector to the sequential circuit to obtain a test result, a comparing section for comparing the test result and an expected output vector to determine whether there is any failure section in the sequential circuit, and for activating the combinational circuit extracting section to determine the current stage combinational circuit which has output terminals as the output boundary, when it is determined that there is the failure section in the sequential circuit.

In order to achieve another aspect of the present invention, a method of estimating a failure section in a sequential circuit, includes the steps of:

(a) determining input vectors each of which sets, to a failure state, at least a predetermined output section as a failure output section of an output boundary of a current stage combinational circuit of the sequential circuit, when it is determined that the failure section is possibly positioned in the current stage combinational circuit;

(b) determining, for each of the estimated input vectors to be applied to an input boundary of the current stage combinational circuit, a failure output propagation region in the current stage combinational circuit, wherein the failure output propagation region represents connection paths between the failure output section and input sections of the input boundary to which the failure output section is indirectly connected;

(c) detecting incorrect output sections which represent normal outputs when a test vector is applied to the sequential circuit and incorrect outputs when the each estimated input vector is applied to the input boundary;

(d) determining an incorrect output propagation region for each of the incorrect output sections, wherein the incorrect output propagation region represents connection paths between the each incorrect output section and input sections of the input boundary to which the each incorrect output section is indirectly connected; and (e) estimating a failure section from the failure output propagation region and the incorrect output propagation region for the each estimated input vector.

DESCRIPTION OF THE PREFERRED EMBODIMENTS

A failure section estimating system of a sequential circuit of the present invention will be described in detail below, with reference to the accompanying drawings.

In the present invention, a failure output propagation region in a current stage combinational circuit is estimated for each of estimated input vectors to provide a failure output, when it is assumed that there is a failure section in the current stage combinational circuit. For this reason, each of the estimated input vectors is inputted to the input boundary of the current stage combinational circuit such that failure output propagation paths are estimated. In the estimation of the failure output propagation paths, failure output propagation paths in the current stage combinational circuit are first extracted. Also, incorrect output propagation paths by which the failure outputs appear at output sections other than the failure output section or a propagation possible region is determined. The determined incorrect output propagation paths are deleted from the extracted failure output propagation paths. Thus, a failure region in the current stage combinational circuit is estimated. Further, a logic product is determined of these estimated failure regions for all the estimated input vectors by which the failure output propagation paths can be determined. Thus, the estimated failure regions can be squeezed.

In this manner, since a combinational circuit is extracted from the output boundary of the sequential circuit in order and the failure output propagation region in the combinational circuit is estimated to all failure states, the failure section can be estimated.

Also, In case of multiple failure such as a bridge failure, the failure output propagation region can be estimated and an estimation error is difficult to be generated.

Further, when the failure output propagation paths are estimated, the failure output propagation paths are extracted from difference of a simulation result from normal expected values. Also, because the estimation of the failure section in the combinational circuit is performed using both of failure output propagation values and the expected values when a test vector is applied, the estimation can be performed efficiently.

Figure 2:
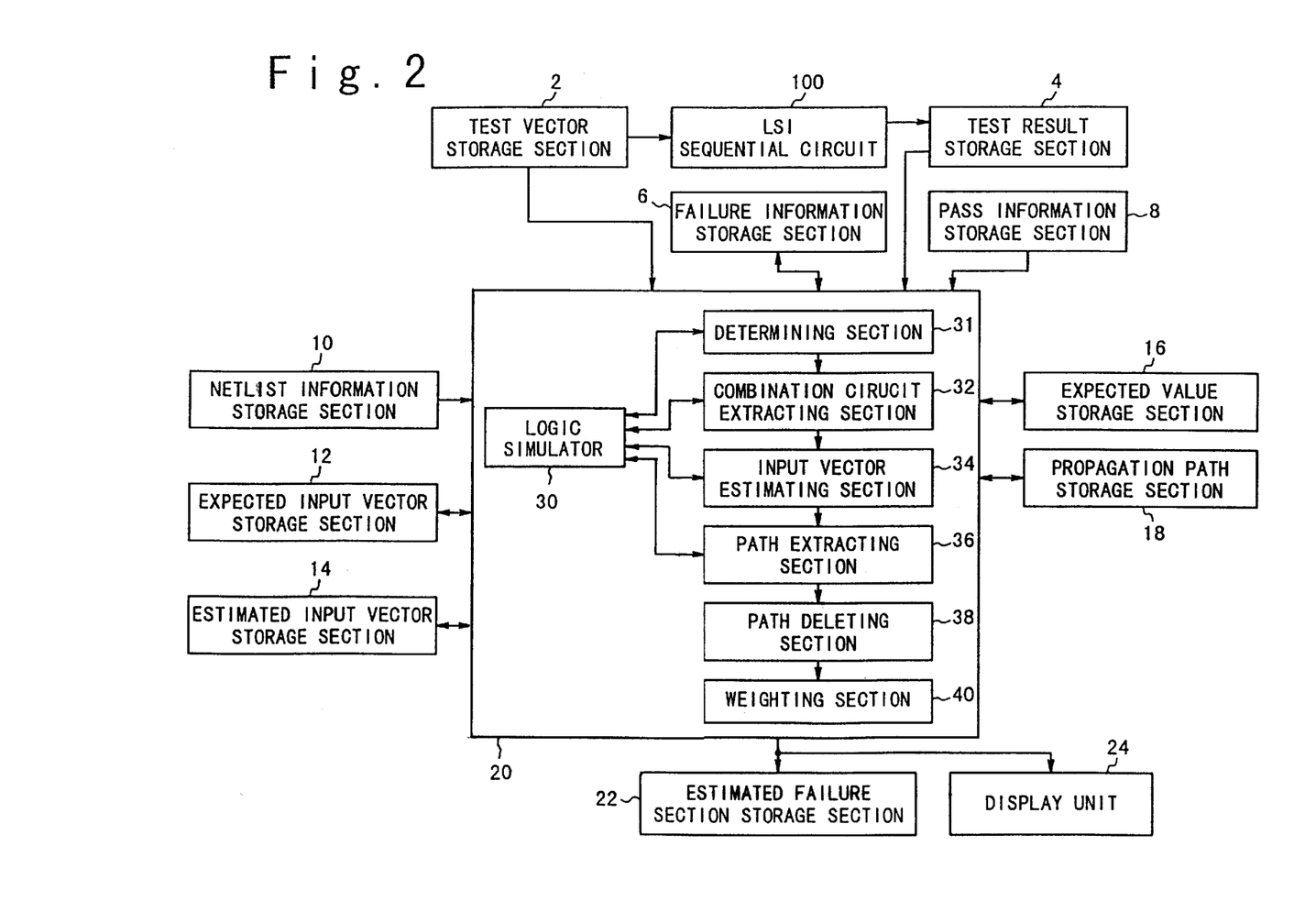
FIG. 2 is a block diagram illustrating the structure of a failure section estimating system of a sequential circuit according to the first embodiment of the present invention.

Next, the failure section estimating system in embodiments of the present invention will be described below. FIG. 2 is a block diagram illustrating the structure of the sequential circuit failure section estimating system according to the first embodiment of the present invention.

Referring to FIG. 2, the sequential circuit failure section estimating system is composed of a test vector storage section 2 for storing a test vector, an LSI as a sequential circuit 100 composed of latch circuits and gate elements, a test result storage section 4 for storing a test result when the test vector is applied to the sequential circuit 100, a failure information storage section 6, a pass information storage section 8 for storing an expected output vector of nodes such as the latch circuits and gate elements when the sequential circuit is normal, a netlist information storage section 10 for storing netlist information indicating information of the nodes and information connections between the nodes, an expected input vector storage section 12 for storing the output states of the latch circuits and input terminals of the sequential circuits, an estimated input vector storage section 14 for storing estimated input vectors, an expected value storage section 16 for storing the expected output values of the nodes of a combinational circuit, a propagation path storage section 18 for storing estimated propagation paths, an estimating section 20, an estimated failure section storage section 22, and a display section 24. The estimating section 20 is composed of a logic simulator 30, a determining section 31, a combinational circuit extracting section 32, a combinational circuit input vector estimating section 34, a path extracting section 36, a path deleting section 38, and a weighting section 40.

Next, the operation of estimating a failure region in the sequential circuit failure section estimating system according to the first embodiment of the present invention using a test vector, failure state information, and connection information (the netlist information) will be described.

Figure 3:
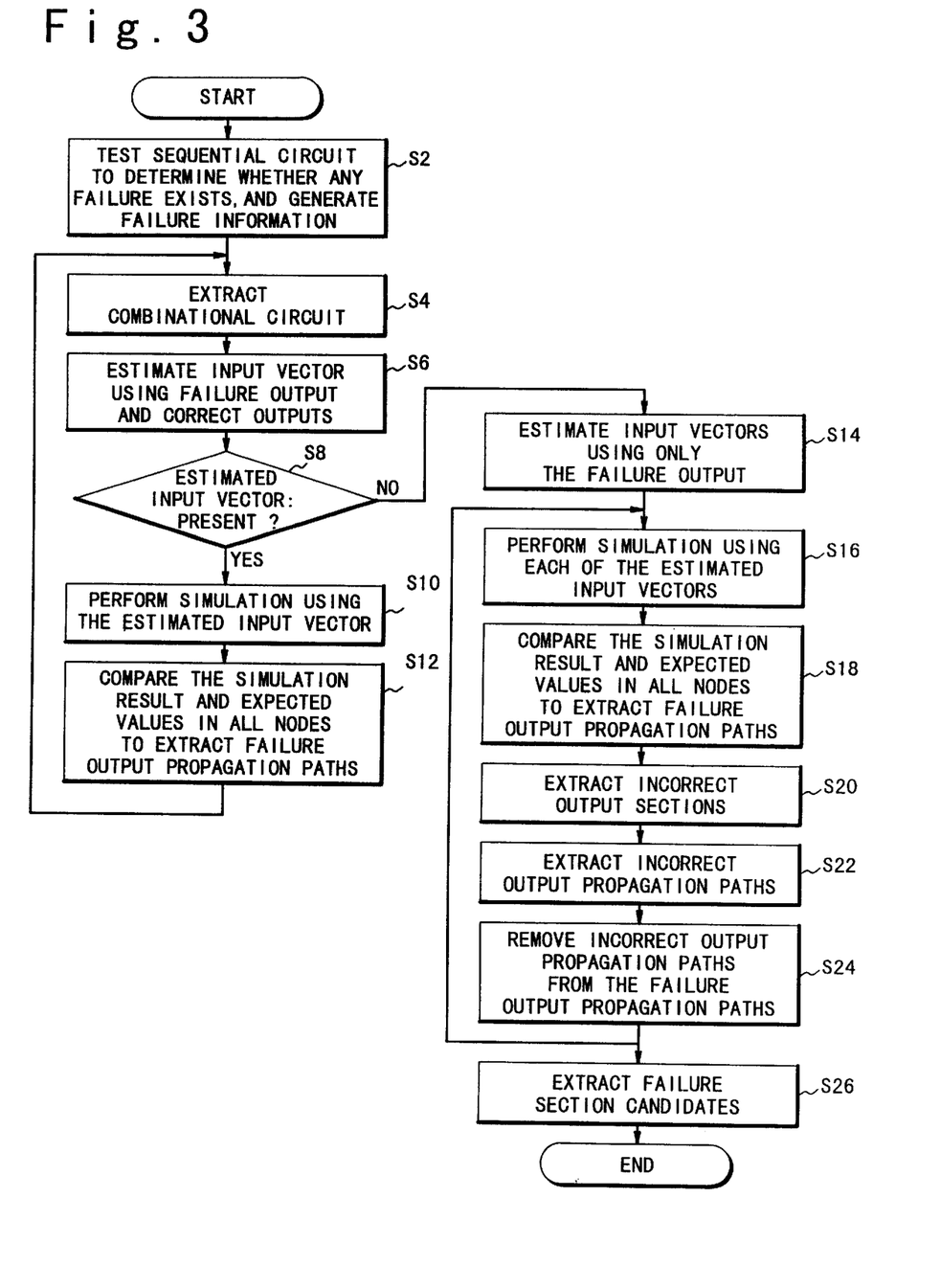
FIG. 3 is a flow chart to explain the operation of the sequential circuit failure section estimating system according to the first embodiment of the present invention.
Figure 5A:
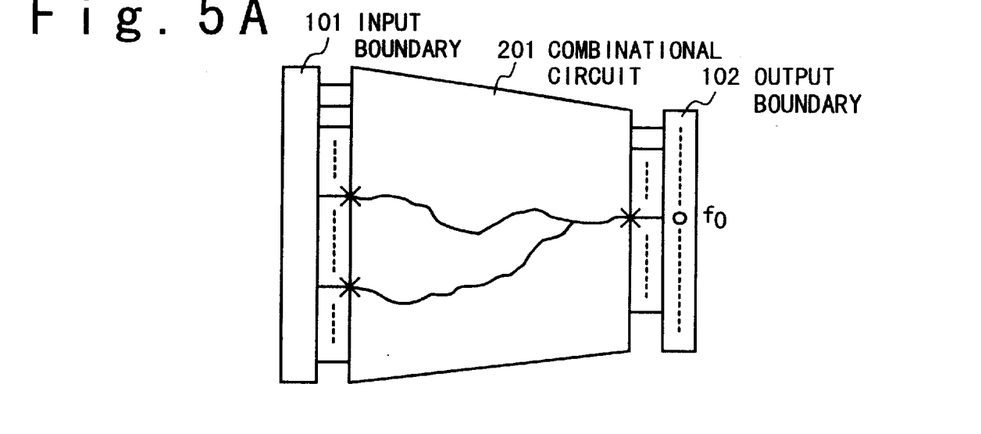
FIG. 5A is a diagram illustrating failure output propagation paths from a current state combinational circuit to a front stage combinational circuit in the sequential circuit failure section estimating system in the first embodiment.
Figure 5B:
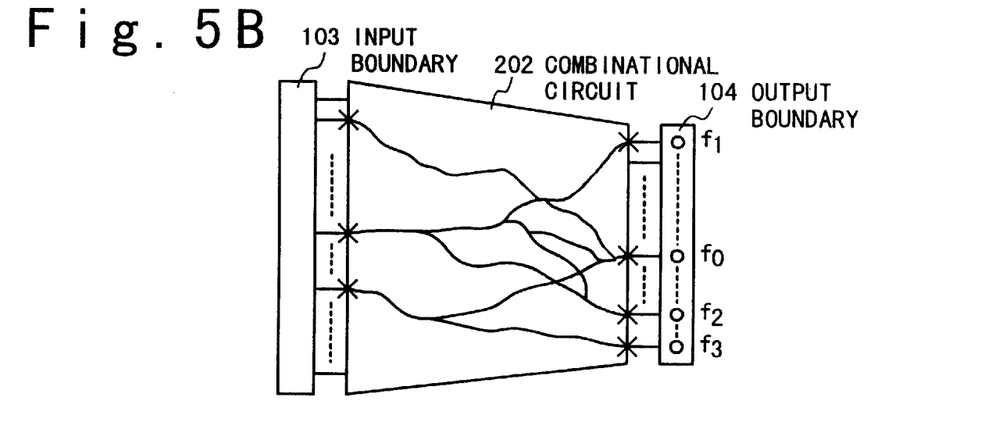
FIG. 5B is a diagram illustrating the failure output propagation paths which exist in the current stage combinational circuit.
Figure 5C:
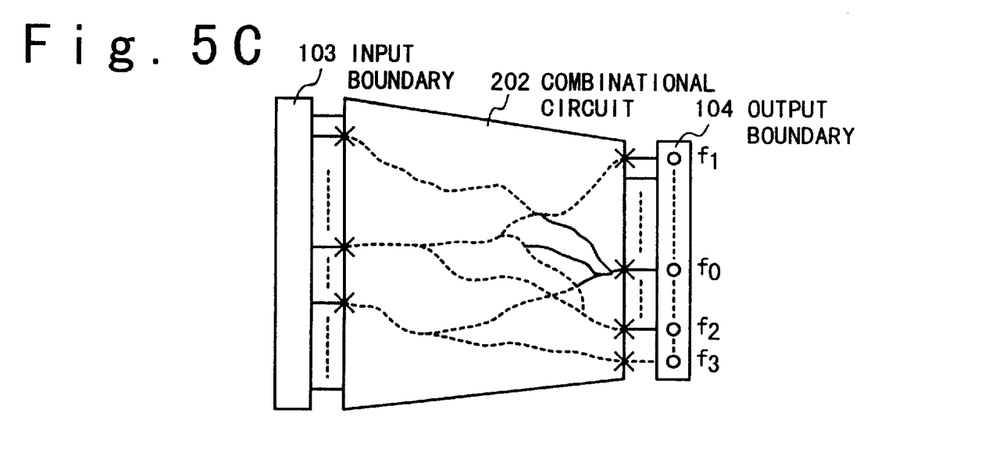
FIG. 5C is a diagram illustrating the method of estimating a failure section by deleting incorrect output propagation paths when the failure output propagation paths exist.

FIG. 3 is a flow chart to explain the operation of the sequential circuit failure section estimating system according to the first embodiment of the present invention. FIG. 5A is a diagram illustrating the failure output propagation paths from a front stage combinational circuit to a current stage combinational circuit in the sequential circuit failure section estimating system in the first embodiment. FIG. 5B is a diagram illustrating the failure output propagation paths when there is a failure section in the current stage combinational circuit, and FIG. 5C is a diagram illustrating the method of estimating a failure section by deleting incorrect propagation paths from the failure output propagation paths.

First, referring to FIG. 3, a test vector is read out from the test vector storage section 2 in a step S2 and applied to the logic simulator 30. The logic simulator 30 reads the netlist information from the netlist information storage section 10. The netlist information represents information of elements of the sequential circuits such as the latch circuits and the gate elements and connection information between the elements. The logic simulator 30 performs simulation based on the netlist information and the test vector. The simulation result provides an expected output vector having correct output section states. The expected output vector is stored in the pass information storage section 8 as pass information. Also, the output states of the latch circuits (L) in the sequential circuit are also stored in the expected input vector storage section 12 for the expected input vectors for combinational circuits. Further, the output states of the latch circuits and gate elements are stored in the expected value storage section 16 for expected values for each of combinational circuits.

The test vector is supplied to the input terminals of the LSI (sequential circuit) 100 as an input boundary. The sequential circuit is composed of latch circuits and gate elements. As a result, a test output vector is obtained at the output terminals of the sequential circuit 100 as an output boundary. The obtained test output vector is stored in the test result storage section 4.

Next, the determining section 31 reads the expected output vector from the pass information storage section 8 and also reads the test output vector from the test result storage section 4 and compares them to each other. If the expected output vector and the test output vector are coincident with each other, this means that there is no failure section in the sequential circuit 100. When the test output vector and the expected output vector are not coincident with each other, this means that the sequential circuit contains any failure section. Therefore, information including the position and output state of the output section whose output is not coincident with the corresponding output of the expected output vector is determined. The determined information is stored in the fail information storage section 6 as failure state information.

Figure 4:
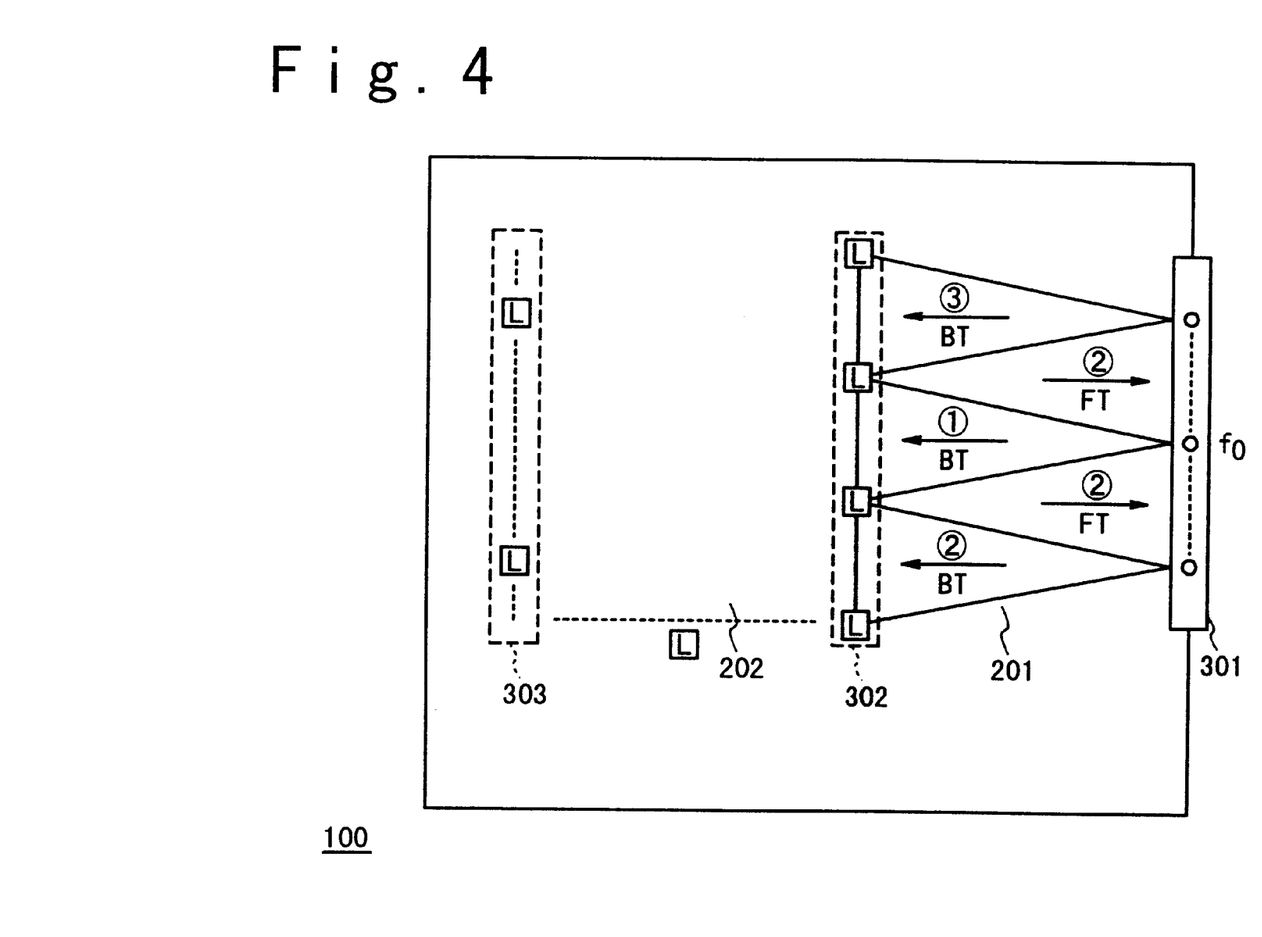
FIG. 4 is a diagram illustrating a combinational circuit in the sequential circuit.

In step S4, the combinational circuit extracting section 32 reads the netlist information from the storage section 10 based on the failure state information and extracts a current stage combinational circuit. For example, it is assumed that a failure output is outputted from an output section which is a latch circuit or an output terminal (an output section f0 in this example). As shown in FIG. 4, signal propagation paths are examined toward the input terminals of the sequential circuit until each of the signal propagation paths reaches an input terminal or a latch circuit from the failure output section f0. That is, a backward trace (BT) ① is performed from the failure output section f0. Thus, a temporary input boundary is determined. Next, signal propagation paths are examined from each of the input sections of the temporary input boundary toward the output terminals until each of signal propagation paths reaches the output terminal or a latch circuit of the combinational circuit 201. That is, a forward trace (FT) ② is performed. Thus, an output boundary 301 of the current stage combinational circuit 201 is determined. Next, like the backward trace (BT) ①, a backward trace (BT) ③ is performed from each of the output sections of the output boundary toward the input terminals of the sequential circuit. Thus, the input boundary 302 of the current stage combinational circuit 201 is finally determined. Also, a current stage combinational circuit 201 is extracted. In this case, the backward trace (BT) ③ may be omitted to determine the combinational circuit 201.

Next, in a step S6, the input vector estimating section 34 estimates an input vector to be applied to the input boundary 302 of the current stage combinational circuit 201 such that the failure state information is satisfied at the output boundary of current stage combinational circuit 201. For example, it is assumed that the failure output appears only at one output section (the latch circuit or the output terminal) f0 of the output boundary 301 of the current stage combinational circuit 201 and the correct outputs appear at the other output sections. In this case, an input vector to be applied to the input boundary 302 is estimated to give such output states of the output boundary. This is accomplished by performing a logic simulation of the current stage combinational circuit 201 by the logic simulator 30, using the netlist information, while changing an input vector, and by comparing the expected values and the output states of the output boundary. In this manner, the input vector is looked for in such a manner that the simulation result becomes identical to the failure state information of the current stage combinational circuit 201.

Next, in a step S8, whether the failure output of the current stage combinational circuit 201 depends on a signal to be propagated from a front stage combinational circuit 202 which is located on the front side of the current stage combinational circuit 201 or any failure in the current stage combinational circuit 201 is determined from the estimated result obtained in step S6. In this determination, if it is possible to estimate an input vector to be applied to the input boundary of the current stage combinational circuit 201, the failure output of the current stage combinational circuit 201 is determined to be dependent upon the signal to be propagated from the front stage combinational circuit 202. On the other hand, if it is impossible to estimate any input vector to be applied to the input boundary of the current stage combinational circuit 201, the failure output state of the current stage combinational circuit 201 is determined to be dependent upon the failure section within the current stage combinational circuit 201.

When the failure output state of the current stage combinational circuit 201 is determined in the step S8 to be dependent upon the signal to be propagated from the front stage combinational circuit 202, a logic simulation is performed in a step S10 using the obtained input vector and the netlist information. The logic simulation is performed by applying the estimated input vector to the input boundary of the current stage combinational circuit 201.

Next, the simulation logic result of all the nodes such as the latch circuit and the gate elements of the current stage combinational circuit 201 in the logic simulation of the step S10 and the expected values of all the nodes of the current stage combinational circuit 201 which has been stored in the expected value storage section 16 are compared with each other in a step S12. Instead, an expected input vector may be read from the storage section 12 to be supplied to the logic simulator 30. As a result, the expected values of all the nodes of the current stage combinational circuit 201 are obtained using the netlist information.

Based on the result of the comparison, the path extracting section 36 extracts failure output propagation paths, as shown FIG. 5A. The input sections (the latch circuits) which are connected to the extracted failure output propagation paths are set as the failure output sections of the output boundary of the front stage combinational circuit 202. The processing of the steps S4 to S8 is performed to the front stage combinational circuit 202 in the same manner as described above.

On the other hand, when the failure output of the current stage combinational circuit 201 is determined in the step S8 to be dependent upon a failure section of the current stage combinational circuit 201, the estimation of input vectors of the current stage combinational circuit 201 is performed in a step S14 only using the failure output section of the output boundary of the current stage combinational circuit 201, e.g., the state value of the output section f0. For example, if the failure output appears at only the output section (the latch circuit or the output terminal) f0 of the output boundary of the current stage combinational circuit 201, the estimation of the input vectors of the input boundary is performed to meet the condition that the failure output appears at the output section f0 regardless of whether correct outputs or incorrect outputs appear at the other output sections of the output boundary of the current stage combinational circuit 201. In this case, the input vector estimating section 34 estimates an input vector by performing the logic simulation of the current stage combinational circuit 201 by the logic simulator 30 using the netlist information, while changing an input vector. As a result, a plurality of estimation input vectors are generally obtained. The obtained estimated input vectors are stored in the storage section 14.

Next, like the steps S10 and S12, the path extracting section 36 controls the logic simulator 30 in a step S16 to perform a logic simulation using the netlist information of each of the input vectors estimated in the step 14.

Next, the path extracting section 36 compares the result of the logic simulation in the step S16 and the expected values of all the nodes of the current stage combinational circuit 201 in a step S18. The expected values are read out from the expected value storage section 16. Instead, the expected values may be obtained by applying the expected input vector to the logic simulator 30. As the result of the comparison, failure output propagation paths are extracted as shown in FIG. 5B. The failure output propagation paths are stored in the storage section 18. In this case, because the state value of only the failure output section is used in the estimation of the input vectors to the current stage combinational circuit 201 in step S14, there is a case where the failure outputs appear at the output sections f1, f2 and f3 at which the correct outputs are outputted when the expected input vector is applied to the input boundary of the current stage combinational circuit 201. Therefore, like the processing in the steps S10 and S12, the output sections f1, f2 and f3 (hereinafter, to be referred to as "incorrect output section") are extracted in a step S20 at which the failure outputs appear in the logic simulation using the estimated input vector and the correct outputs appear in the logic simulation using the expected input vector.

The path extracting section 36 compares the logic simulation result of all the nodes of the current stage combinational circuit 201 and the expected values of all the nodes in a step S22, and extracts incorrect output propagation paths to each of the incorrect output sections f1, f2 and f3.

Next, in a step S24, the path deleting section 38 deletes the incorrect output propagation paths extracted in the step S22 from the failure output propagation path extracted in the step S18 and extracts a failure path candidate, as shown in FIG. 5C.

After that, the processing from the above steps S16 to S24 is repeated to each of the input vectors estimated in the step S14.

The weight section 40 calculates a logic product to the failure path candidates extracted for the respective estimated input vectors and allocates a priority level to a failure section candidate. In this manner, weighted candidate path regions are extracted in a step S26. The weighted candidate path regions are stored in the estimated failure section storage section 22 as the estimated failure sections. At the same time, the weighted candidate path regions are displayed on the display unit 24.

Next, the sequential circuit failure section estimating system according to the second embodiment of the present invention will be described.

Figure 6:
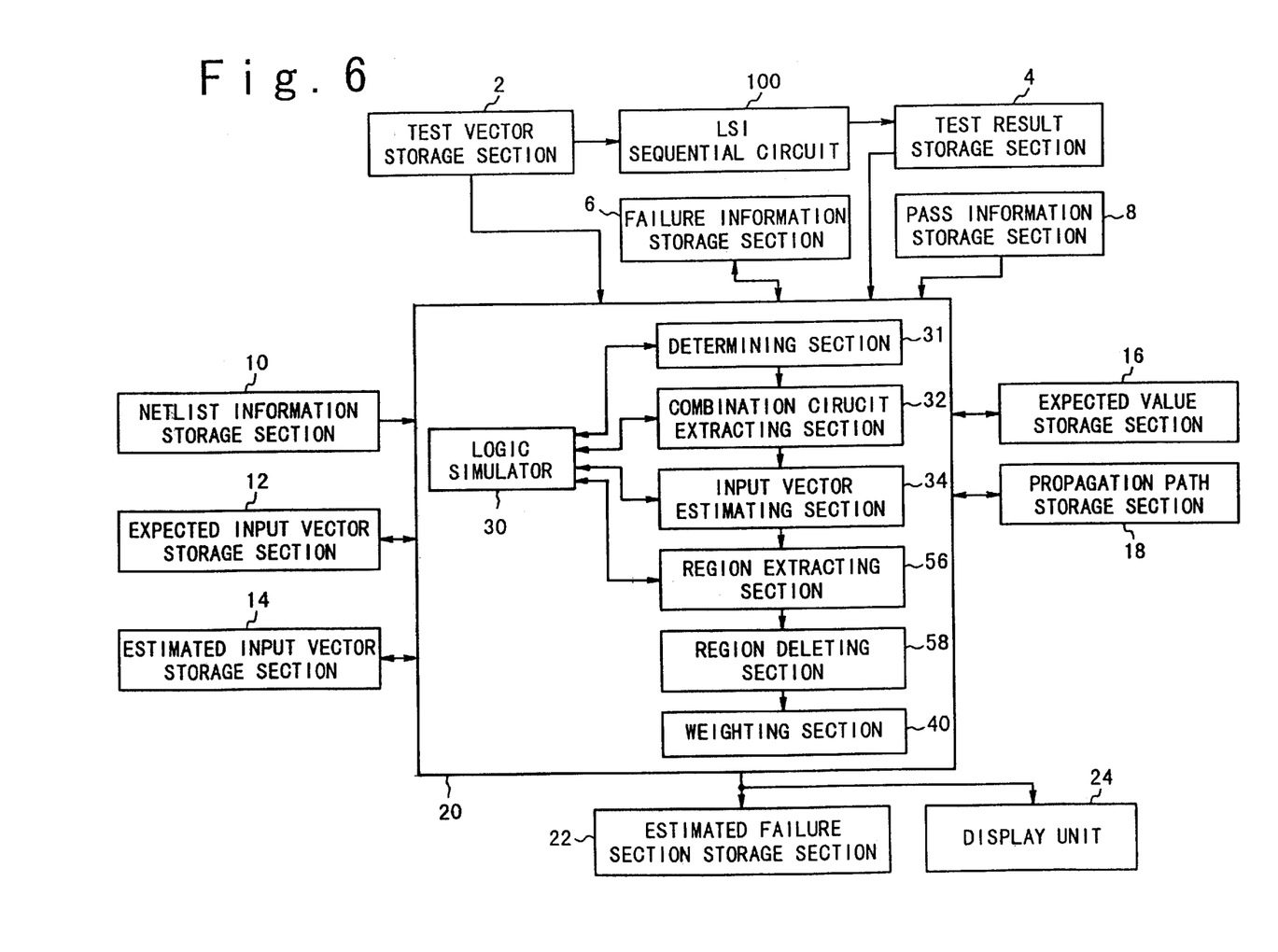
FIG. 6 is a block diagram illustrating the structure of a failure section estimating system of a sequential circuit according to the second embodiment of the present invention.

FIG. 6 is a block diagram illustrating the structure of the sequential circuit failure section estimating system according to the second embodiment of the present invention. Referring to FIG. 6, the sequential circuit failure section estimating system is composed of a test vector storage section 2, an LSI 100 of a sequential circuit, a test result storage section 4, a fail information storage section 6, a pass information storage section 8, a netlist information storage section 10, a combinational circuit expected input vector storage section 12, an estimated input vector storage section 14, a combinational circuit expected value storage section 16, a propagation path storage section 18, an estimating section 20, an estimated failure region storage section 22, and a display section 24. The estimating section 20 is composed of a logic simulator 30, a determining section 31, a combinational circuit extracting section 32, a combinational circuit input vector estimating section 34, a region extracting section 36, a region deleting section 58, and a weighting section 40.

Figure 7:
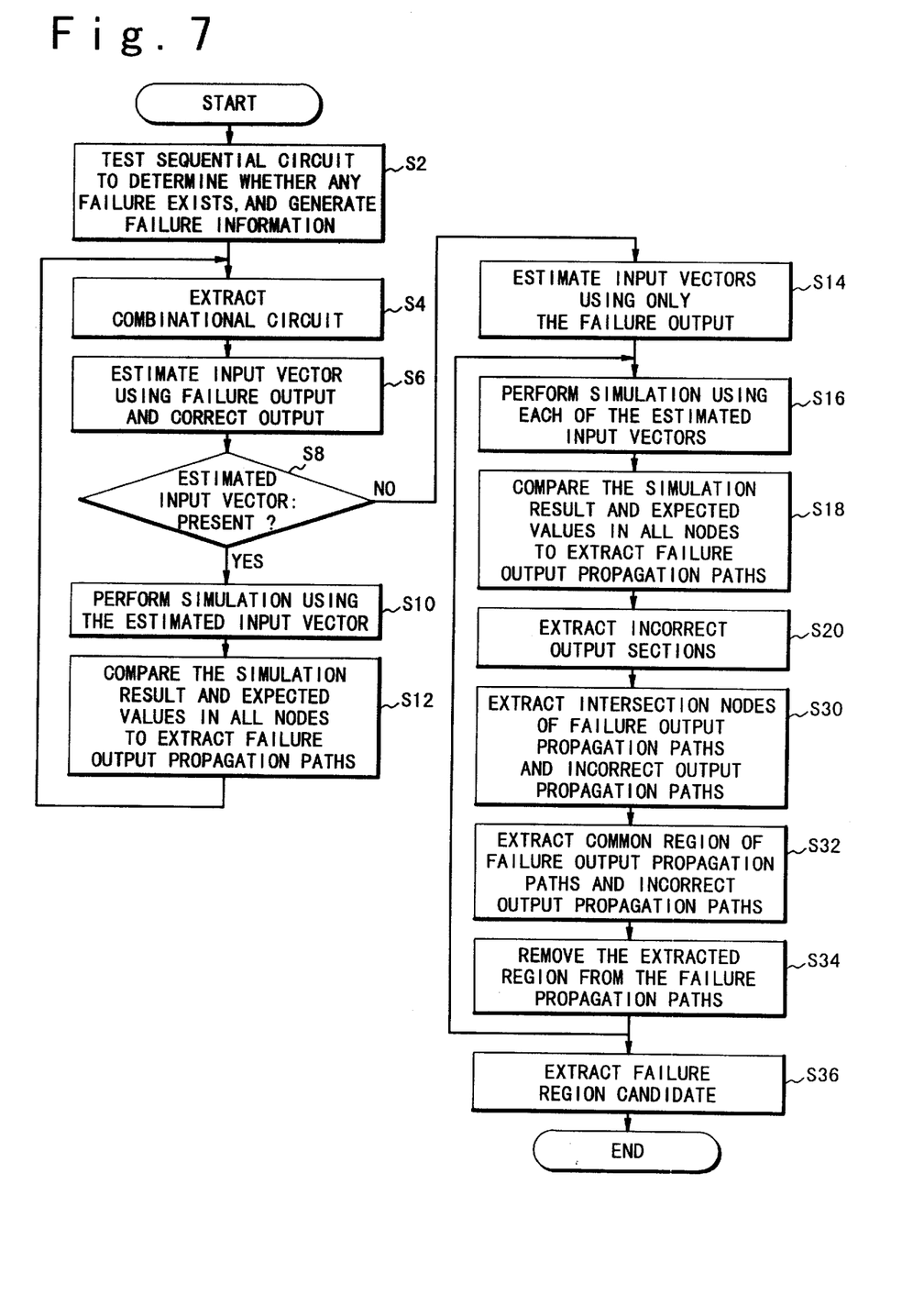
FIG. 7 is a flow chart to explain the operation of the sequential circuit failure section estimating system according to the first embodiment of the present invention.

FIG. 7 is a flow chart to explain the operation of the sequential circuit failure section estimating system according to the second embodiment of the present invention. Here, because the processing of the steps S2 to 12 is the same as those of the first embodiment, the description is omitted.

When it is determined in the step S8 that the failure output is due to a failure section within the current stage combinational circuit 201, the estimation of the input vector of the current stage combinational circuit 201 is performed in the step S14 using only the state value of the failure output of the output boundary of the current stage combinational circuit 201, as in the first embodiment.

Next, a logic simulation is performed in the step S16 using one of the estimated input vectors estimated in the step 14, as in the first embodiment.

Next, the result values of the logic simulation in the step S16 and the expected values of all the nodes in the current stage combinational circuit 201 are compared in the step S18, as in the first embodiment. Thus, the region extracting section 56 extracts a failure output propagation path.

Further, in the step S20, the region extracting section 36 extracts the incorrect output sections and the incorrect output propagation paths when a logic simulation is performed, as in the first embodiment. The incorrect output sections outputs the correct outputs when the simulation is performed using the netlist information and the expected input vector and the failure outputs when the simulation is performed using the estimated input vector and the netlist information.

Figure 8:
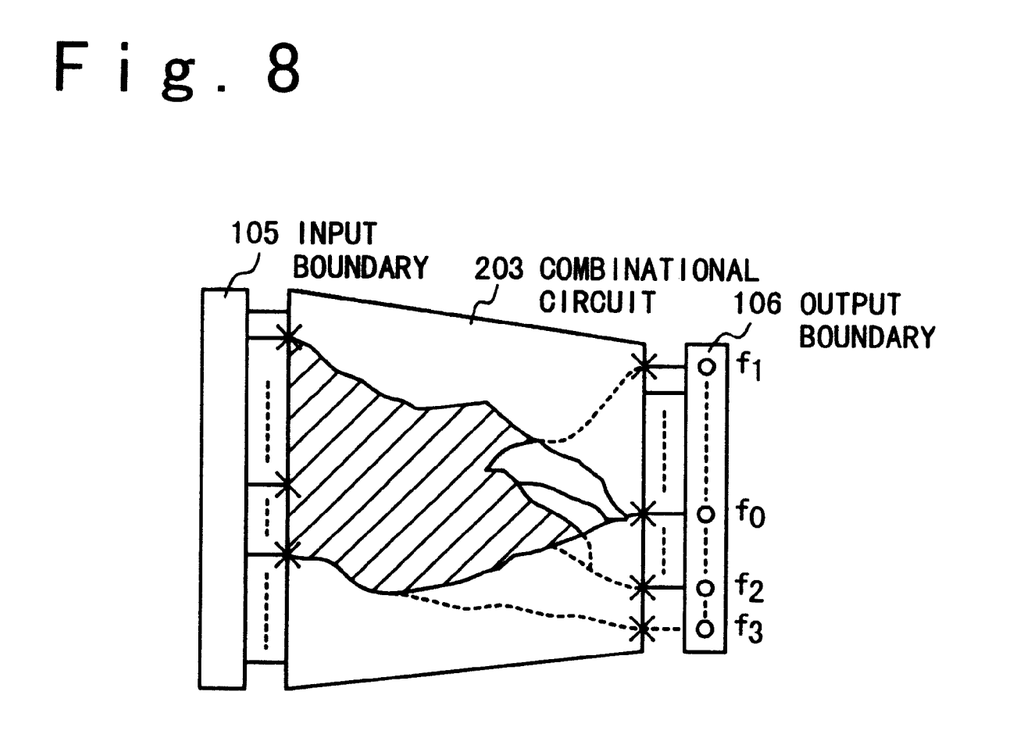
FIG. 8 is a diagram illustrating the method of estimating a failure section by deleting a common region of the failure output propagation paths and the incorrect output propagation path when a failure section exists in the current stage combinational circuit in the sequential circuit failure section estimating system in the second embodiment.

Next, in a step S30, the region deleting section 58 determines a common node as an intersection node C which the failure output propagation path extracted in the step S18 and the incorrect output propagation path extracted in the step S20 intersect with each other, as shown in FIG. 8.

In this case, when the failure output is propagated to the intersection node C determined in the step S30, the failure output should be propagated to the output sections of the incorrect output states in addition to the failure output section. Therefore, the failure output is not propagated to the intersection node C. Similarly, the failure output is not propagated from the input boundary 302 to the region which is connected to the intersection node C. Therefore, in the step S32, the region deleting section 58 extract a common region (the slanted line part at FIG. 8) from the intersection node C determined in the step S30 to the input boundary. Next, in a step S34, the region deleting section 58 deletes the common region of the failure output propagation paths and the incorrect propagation paths from the region of the failure output propagation path extracted in the step S18. That is, the region of the incorrect output propagation paths is deleted from the failure output propagation paths. In this manner, the failure region candidate is extracted, as shown in FIG. 8 by the solid line.

After that, the processing of the steps S16 to S34 is repeated for each of the estimated input vectors.

Finally, in a step S36, the weighting section 40 performs a logic product to the extracted failure candidate regions and allocates a priority level to each node of the failure candidate regions. In this manner, the weighted failure candidate regions are determined. The weighted failure candidate regions are stored in the estimated failure section storage section 22 as the estimated failure sections. At the same time, the weighted failure candidate regions are displayed on the display unit 24.

Figure 9:
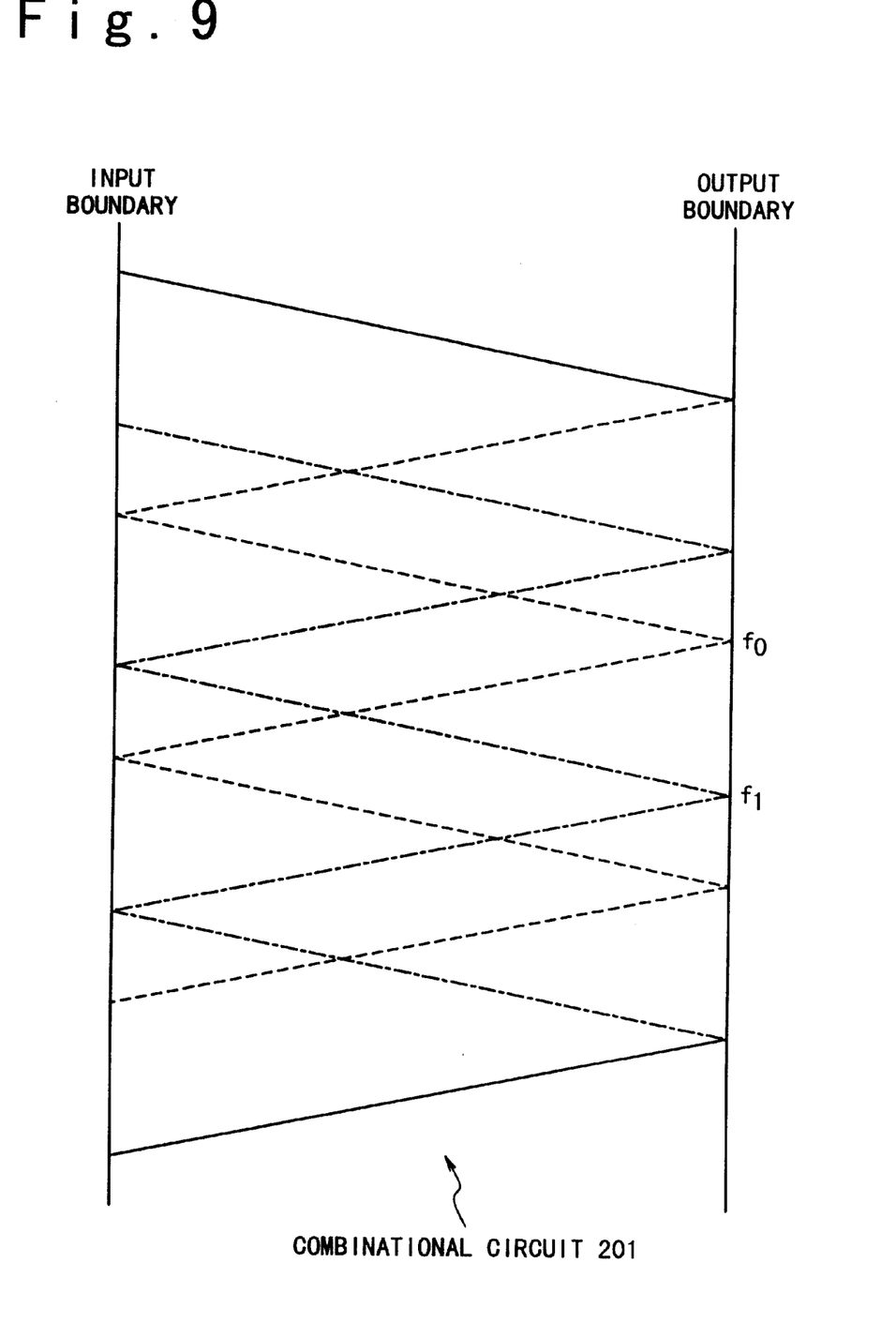
FIG. 9 is a diagram illustrating the method of extracting a combinational circuit in the case of a plurality of failure output sections.

In case of extraction of the combinational circuit in the step S4, a set of backward trace, forward trace and backward trace is performed. However, only the backward trace and forward trace may be performed. Also, as shown in FIG. 9, when the plurality of failure output sections exist, the set of backward trace, forward trace and backward trace may be performed to each of the plurality of failure output sections. Thus, the combinational circuit may be extracted.

As described above, according to the present invention, a combinational circuit is extracted from the output boundary of the sequential circuit for each of failure output sections. Then, a failure section is estimated using the estimated input vector for the input boundary of the combinational circuit. In accordance with, the number of times of the simulation is (the number of extracted combinational circuits)×(the number of estimated input vectors). In this manner, the number of times of the simulation is less, compared with the case where a failure section is inserted to all signal lines of all the circuits and a failure dictionary is produced to all the vectors.

Also, the failure simulation is performed only to the extracted combinational circuit. Therefore, it is possible to decrease the computation quantity, compared with the simulation of the whole circuit.

Further, the extraction of the failure output propagation path in the combinational circuit is performed only by comparing the failure simulation result when the estimated input vector is applied to the input boundary of the combinational circuit and the simulation result when the expected input vector is applied to the input boundary. For this reason, the computation quantity can be suppressed. Also, the failure output propagation path can be extracted to a re-contraction circuit in the combinational circuit.

Further, the estimation of a failure section in the combinational circuit is performed by determining the input vectors to the combinational circuit such that the failure output appears at the output section, and by deleting the paths where the failure output is outputted to the other correct output sections. Therefore, the present invention can cope with a multiple failures such as a bridge failure which the system using the failure dictionary can not cope with.

In this manner, the present invention can cope with a multiple failure in addition to a single independent failure. Therefore, an estimation error is not possibly generated.

What is claimed is:

1. A failure section estimating apparatus for a sequential circuit, comprising:

input vector estimating means for estimating input vectors each of which defines at least a predetermined output section as a failure output section of an output boundary of a current stage combination circuit of said sequential circuit, when the input vector estimating means determines that said failure section is positioned in said current stage combination circuit;

failure output propagation path determining means for determining a failure output propagation region in said current stage combination circuit for each of said estimated input vectors to be applied to an input boundary of said current stage combination circuit, wherein said failure output propagation region represents connection paths between said failure output section and input sections of said input boundary, said failure output section being indirectly connected to said input section;

detecting means for detecting incorrect output sections, which incorrect output sections are determined to incorrectly represent normal outputs when a test vector is applied to said sequential circuit and incorrect outputs when said each estimated input vector is applied to said input boundary;

incorrect output propagation path determining means for determining an incorrect output propagation region for each of said incorrect input sections, wherein said incorrect output propagation region represents connection paths between said each incorrect output section and input sections of said input boundary to which said each incorrect output section is indirectly connected; and failure section estimating means for estimating a failure section from said failure output propagation region and said incorrect output propagation region for said each estimated input vector.

2. A failure section estimating apparatus for a sequential circuit according to claim 1, wherein said failure section estimating means includes:

means for disconnecting said incorrect output propagation region for said each estimated input vector from said failure output propagation region, wherein a remaining portion is said failure section.

3. A failure section estimating apparatus for a sequential circuit according to claim 1, wherein said failure section estimating means includes:

means for detecting an intersection node between said failure output propagation region and said incorrect output propagation region for said each estimated input vector; and means for disconnecting a part of said incorrect output propagation region which is located on an input boundary side from the detected intersection node from said failure output propagation region, wherein a remaining portion is said failure section.

4. A failure section estimating apparatus for a sequential circuit according to claim 1, wherein said failure section estimating means includes:

means for weighting said failure section estimated from said failure output propagation region and said incorrect output propagation region for said each estimated input vector for all the estimated input vectors.

5. A failure section estimating apparatus for a sequential circuit according to claim 1, further comprising:

combination circuit extracting means for extracting said current stage combination circuit when it is determined that there is said failure section in said sequential circuit; and determining means for determining whether there is said failure section in said current stage combination circuit of said sequential circuit, and for activating said combination circuit extracting means for a front stage combination circuit which has said input boundary of said current stage combination circuit as an output boundary.

6. A failure section estimating apparatus for a sequential circuit according to claim 5, further comprising:

test means for applying said test vector to said sequential circuit to obtain a test result;

comparing means for comparing the test result and an expected output vector to determine whether there is any failure section in said sequential circuit, and for activating said combination circuit extracting means to determine said current stage combination circuit which has output terminals as said output boundary, when it is determined that there is said failure section in said sequential circuit.

7. A method of estimating a failure section in a sequential circuit, comprising the steps of:

(a) determining input vectors which define at least a predetermined output section of an output boundary of a current stage combination circuit of said sequential circuit to a failure state and as a failure output section, when said failure section is determined to be possibly positioned in said current stage combination circuit;

(b) determining, for each of said estimated input vectors to be applied to an input boundary of said current state combination circuit, a failure output propagation region in said current stage combination circuit, wherein said failure output propagation region represents connection paths between said failure output section and input sections of said input boundary, which paths being indirect;

(c) detecting incorrect output sections, which incorrect output sections are determined to incorrectly represent normal outputs when a test vector is applied to said sequential circuit and incorrect outputs when said each estimated input vector is applied to said input boundary;

(d) determining an incorrect output propagation region for each of said incorrect output sections, wherein said incorrect output propagation region represents connection paths between said each incorrect output section and input sections of said input boundary to which said each incorrect output section is indirectly connected; and (e) estimating a failure section from said failure output propagation region and said incorrect output propagation region for said each estimated input vector.

8. A method according to claim 7, wherein said step of (e) estimating a failure section includes:

disconnecting said incorrect output propagation region for said each estimated input vector from said failure output propagation region, wherein a remaining portion is said failure section.

9. A method according to claim 7, wherein said step of (e) estimating a failure section includes:

detecting an intersection node between said failure output propagation region and said incorrect output propagation region for said each estimated input vector;

disconnecting a part of said incorrect output propagation region which is located on an input boundary side from the detected intersection node from said failure output propagation region, wherein a remaining portion is said failure section.

10. A method according to claim 7, wherein said step of (e) estimating a failure section includes:

weighting said failure section estimated from said failure output propagation region and said incorrect output propagation region for said each estimated input vector for all the estimated input vectors.

11. A method according to claim 7, further comprising the steps:

(f) extracting said current stage combination circuit when it is determined that there is said failure section in said sequential circuit;

(g) determining whether there is said failure section in said current stage combination circuit of said sequential circuit; and (h) executing said step (f) for a front stage combination circuit which has said input boundary of said current stage combination circuit as an output boundary.

12. A method according to claim 11, further comprising the step of:

applying said test vector to said sequential circuit to obtain a test result;

comparing the test result and an expected output vector to determine whether there is any failure section in said sequential circuit; and executing said step (f) to determine said current stage combination circuit which has output terminals as said output boundary, when it is determined that there is said failure section in said sequential circuit.

* * * * *